United States Patent
Reznic et al.

US 8,006,168 B2
Aug. 23, 2011

(54) APPARATUS AND METHOD FOR APPLYING UNEQUAL ERROR PROTECTION DURING WIRELESS VIDEO TRANSMISSION

(75) Inventors: Zvi Reznic, Tel Aviv (IL); Meir Feder, Herzliya (IL); Shay Freundlich, Givat Ada (IL)

(73) Assignee: Amimon Ltd, Herzlia (IL)

( * ) Notice: Subject to any disclaimer, the term of this patent is extended or adjusted under 35 U.S.C. 154(b) by 1281 days.

(21) Appl. No.: 11/613,053

(22) Filed: Dec. 19, 2006

(65) Prior Publication Data
US 2007/0198887 A1 Aug. 23, 2007

Related U.S. Application Data

(60) Provisional application No. 60/752,155, filed on Dec. 19, 2005.

(51) Int. Cl.
*H03M 13/00* (2006.01)
(52) U.S. Cl. .............. 714/774; 375/240.2; 375/240.27
(58) Field of Classification Search .................. 714/774; 375/240.2, 240.27
See application file for complete search history.

(56) References Cited

U.S. PATENT DOCUMENTS

| | | | |
|---|---|---|---|
| 5,267,021 A | 11/1993 | Ramchandran et al. | |
| 5,666,370 A * | 9/1997 | Ganesan et al. | 714/752 |
| 6,292,917 B1 | 9/2001 | Sinha et al. | |
| 2003/0182620 A1 | 9/2003 | Errico et al. | |
| 2003/0229822 A1* | 12/2003 | Kim et al. | 714/18 |
| 2005/0271146 A1 | 12/2005 | Errico et al. | |
| 2006/0209745 A1 | 9/2006 | MacMullan et al. | |
| 2006/0209890 A1 | 9/2006 | MacMullan et al. | |
| 2006/0209892 A1 | 9/2006 | MacMullan et al. | |
| 2006/0212911 A1 | 9/2006 | MacMullan et al. | |
| 2007/0098063 A1* | 5/2007 | Reznic et al. | 375/240.2 |
| 2007/0291855 A1* | 12/2007 | Reznic et al. | 375/240.27 |

FOREIGN PATENT DOCUMENTS

| | | |
|---|---|---|
| WO | 2006/101801 | 9/2006 |
| WO | 2006/118964 | 11/2006 |

OTHER PUBLICATIONS

Halbach, T, "Unequal Error Protection of SNR Scalable DPCM Coded Video", Proceedings of the Data Compression Conference (DCC'04).
Rane, S, et al, "Systematic Lossy Error Protection versus Layered Coding with Unequal Error Protection", Stanford University.
Qu, Q, et al, "Error resilient wireless video transmission using motion based unequal error protection and intraframe packet interleaving", Image Processing, 2004, ICIP '04, vol. 2, Oct. 24-27, 2004, p. 837-840 vol 2.

* cited by examiner

*Primary Examiner* — Guy Lamarre
(74) *Attorney, Agent, or Firm* — Eitan Mehulal Law Group

(57) ABSTRACT

Wireless transmission of high-definition video, whether essentially uncompressed or compressed, is prone to errors during reception due to the condition of the wireless link. To ensure video quality during changing link conditions it is desirable to ensure that those portions of the video that represent the more important components of the video signal, such as the lower special frequencies or most significant bits, are assured correct reception at the receiver. Bandwidth limitations of the wireless link affect the amount of data that can be sent over the link. Hence, using a high level error recovery for all of the information is not feasible. Accordingly, a method and apparatus for unequal error protection is disclosed that provides a higher level of error protection to the more important elements of the transmission while affording less error protection to the other elements of the transmission.

18 Claims, 4 Drawing Sheets

| Type of Bits | Type of UEP |
|---|---|
| Most Important components and bits | Full error correction |
| Important components and bits | Partial error correction |
| Least important components and bits | Error detection |

FIGURE 5

APPARATUS AND METHOD FOR APPLYING UNEQUAL ERROR PROTECTION DURING WIRELESS VIDEO TRANSMISSION

CROSS REFERENCE TO RELATED APPLICATIONS

This application claims priority from U.S. provisional application Ser. No. 60/752,155, filed on Dec. 19, 2005.

BACKGROUND OF THE INVENTION

1. Field of the Invention

The invention relates to the transmission and reception of video over a wireless link. More specifically, the invention relates to the transmission and reception of high-definition video over a wireless link during varying link condition, by applying an unequal error protection to the video data.

2. Discussion of the Prior Art

In many houses, television and/or video signals are received through cable or satellite links at a set-top box at a fixed point in the house. In many cases, it is desired to place a screen at a point a distance from the set-top box by a few meters. This trend is becoming more common as flat-screen using plasma or liquid crystal display (LCD) televisions are hung on a wall. Connection of the screen to the set-top box through cables is generally undesired for aesthetic reasons and/or installation convenience. Thus, wireless transmission of the video signals from the set-top box to the screen is preferred. Similarly, it may be desired to place a computer, game controller, VCR, DVD, or other video source that generates images to be displayed on a screen a distance from the screen.

Generally, the data are received at the set-top box compressed in accordance, for example, with the motion picture expert group (MPEG) format and are decompressed by the set-top box to a high quality raw video signal. The raw video signal may be in an analog format or a digital format, such as the digital video interface (DVI) format or the high definition multimedia interface (HDMI) format. These digital formats generally have a high definition television (HDTV) data rate of up to about 1.5 Giga bits per second (Gbps).

Transmit a video image having such high bit rates it is necessary either to use sophisticated techniques for sending essentially uncompressed high-definition video or use a variety of compression technologies made available through standard or non-standard specification. A technique for sending essentially uncompressed high-definition video is described in detail in U.S. patent application Ser. No. 11/551,641, entitled Apparatus and Method for Uncompressed, Wireless Transmission of Video, assigned to a common assignee and incorporated herein in its entirety by reference thereto. Compression technologies include a variety of MPEG standard such as MPEG2, MPEG4, JPEG2000, wavelet technology, and the like. According to these technologies a transform is performed, for example a discrete cosine transform (DCT), resulting in a various coefficients representing the transformed image.

Wireless conditions may change over time, becoming worse or better, depending on a plurality of reasons. The changing conditions may result in a degradation of the video signal as conditions worsen. Regardless of the methods used above, it is well known that the coefficients generated by the variety of methods used have a varying degree of importance. For example, the coefficients representing lower spatial frequencies are more important for the creation of the reconstructed video at the receiver end than the coefficients representing the high spatial frequencies. Therefore, to ensure quality reception of wireless transmission of video, and, in particular, high-definition video it is important to ensure that as many of the lower-frequency coefficients as possible are received correctly.

In view of a variety of limitations of the prior art, it would be advantageous to provide a solution that enables reliable wireless transmission of high-definition video giving priority to the correct reception of those components of the transmission representing the higher importance components of the video image being transmitted.

SUMMARY OF THE INVENTION

Wireless transmission of high-definition video, whether essentially uncompressed or compressed, is prone to errors during reception due to the condition of the wireless link. To ensure video quality during changing link conditions it is desirable to ensure that those portions of the video that represent the more important components of the video signal, such as the lower special frequencies or most significant bits, are assured correct reception at the receiver. Bandwidth limitations of the wireless link affect the amount of data that can be sent over the link. Hence, using a high level error recovery for all of the information is not feasible. Accordingly, a method and apparatus for unequal error protection is disclosed that provides a higher level of error protection to the more important elements of the transmission while affording less error protection to the other elements of the transmission.

BRIEF DESCRIPTION OF FIGURES

FIG. 5 is a table depicting a UEP scheme in accordance with the invention.

DETAILED DESCRIPTION OF EMBODIMENTS

Figure 1:
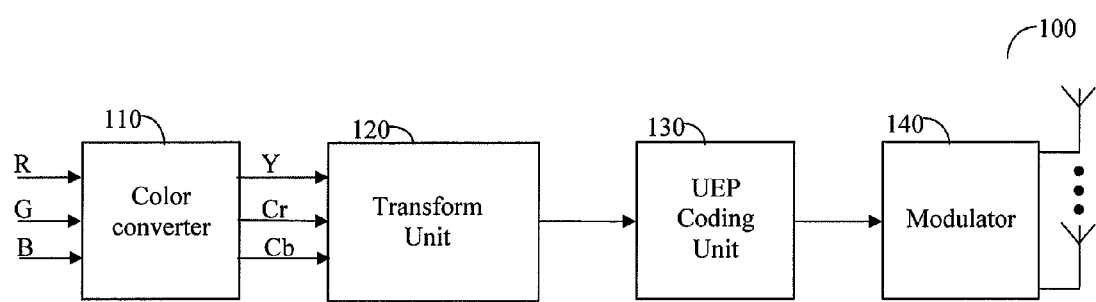
FIG. 1 is a block diagram of a transmitter configured to apply unequal error protection during the transmission of video according to the invention.

Wireless transmission of high-definition video, whether essentially uncompressed or compressed, is prone to errors in the reception due to the conditions of the wireless link. To ensure video quality during changing link conditions it is important that those portions of the video that represent the more important components of the video signal, such as the lower spatial frequencies or most significant bits, are correctly received at the receiver. Bandwidth limitations of the wireless link limit the amount of data that can be sent over the link. Hence, using a high level error recovery scheme for all the information is not feasible. Accordingly, an unequally error protection is implemented that provides a higher level of error protection to the most important elements in the transmission, while affording loss error protection to the other elements in the transmission.

Video information may be considered to be divided into layers, where data each layer has different importance and certain layers contribute more to the quality of the image than others. Typically, video images pass a transform, such as a discrete cosine transform (DCT), wavelet, or others. This results in a plurality of coefficients where there are coefficients that are more important and other coefficients which are less important. In a DCT, for example, coefficients of the lower frequencies are most important, while in a wavelet transform the stronger wavelet coefficients are more important. In addition, in each representation the most significant bits (MSB) are more important than the least significant bits (LSB). When using, for example, the JPEG2000 compression, the layers are defined by the standard.

In accordance with the invention, the bits in these layers go through unequal error protection (UEP). UEP means that the more important layers are protected more than the less important layers. Better protection may be achieved by the use of a stronger error correction code (ECC), i.e., a code that is particularly resilient and that can correct errors even if all or most of the bits are incorrectly received. Another way of providing a higher degree of protection is by using an appropriate modulation scheme. In one embodiment of the invention, the outcome of the coding may be combined with an appropriate modulation. Less important layers are sent with lesser degrees of protection. This can be, for example, a capability of correcting up to a predefined number of bits, where a more important layer is able to recover with more bits in error than in the case of a less important layer. The least important layers may be sent with a simple error detection scheme and, upon detection of an error at the receiver side the layer is not-used. The modulated signal is sent over the wireless channel. Due to fading the level of noise varies. Hence, in this case of weak fading, all the data is transferred because the noise does not impact even the low importance layers. In case of stronger fading in the wireless channel, only the important layers are actually used because their better error protection allows for their reconstruction even when the channel conditions are significantly less than acceptable.

The techniques disclosed herein may also be implemented with a video system such as that disclosed in U.S. patent application Ser. No. 11/551,641 entitled Apparatus and Method for Uncompressed, Wireless Transmission of Video, assigned to a common assignee, and that is incorporated herein by this reference thereto. In accordance with the invention, the most significant layers are referred to as the digital or coarse portion of the video signal. Less significant layers are referred to as the analog or fine portion of the video signal. While the analog transmission naturally provides a version of UEP, the apparatus and method disclosed herein provide further capabilities to such UEP.

FIG. 1 shows an exemplary and non-limiting block diagram of a transmitter 100 configured for UEP transmission. A video signal may be received, for example, with RGB components that are transformed to Y, Cr, and Cb components by a color converter 110. A de-correlating transform, for example a discrete cosine transform (DCT), is performed as a transform unit 120 to generate certain coefficients respective of the video signal. The data stream received has various components and bits that have different levels of importance. For example, components respective of a lower frequency of the video signal have generally a higher importance that the components having higher frequencies. Within a number represented by a plurality of bits, the most significant bits (MSBs) are of higher importance than the least significant bits (LSBs). Because a wireless channel is prone to certain transmission errors, it would be advantageous to send the data stream in a fashion that allows a receiver to perform an error correction that results in a complete recovery from the errors introduced by, for example, the channel conditions. The performance of full error correction requires the use of additional bits which may be more than can be used to send the video signal over the channel. Therefore, in accordance with the invention, an unequal error protection (UEP) coding unit 130 is used. The UEP coding unit 130 receives from the transform unit 120 an indication respective of the importance of the components and the bits that allows for a decision to be made concerning how to perform the coding.

The resulting signal is then modulated by a modulator 140 and transmitted by an antenna 150, which may be a multiple-input multiple-output (MIMC) antenna.

FIG. 5 is a table of exemplary types of UEP. The first column refers to the importance level of the components and bits, the second column refers to the type of UEP used. For the most important components and bits, a UEP that enables full error correction is used. Such an error correction requires a relatively large number of redundancy bits. When an error in the group of bits received is detected, the error correction mechanism is capable of correcting a large number of errors in the received data. For less important bits a partial error correction scheme may be introduced, allowing for the detection and correction of a limited number of bits received in error. In such cases, at times the error is both detected and corrected, while in others only a detection is made but no correction is possible. The number of errors to be corrected impacts the amount of data required to perform a correction. The higher the number of bits, the more additional data are needed. The least important components and bits may have a UEP that only provides a detection mechanism, thereby allowing the detection of an error but without a capability actually to correct such error. In one embodiment of the invention, correction is performed by using a history buffer on the receiver side, an embodiment described in more detail in a U.S. provisional patent application entitled An Apparatus for Enhanced Wireless Transmission and Reception of Uncompressed Video, assigned to a common assignee and which is incorporated herein in its entirety by this reference thereto. A person skilled in the art would recognize that a variety of error correction and error detection mechanism may be used to satisfy the UEP requirements disclosed herein and these are within the scope of the invention.

Figure 2:
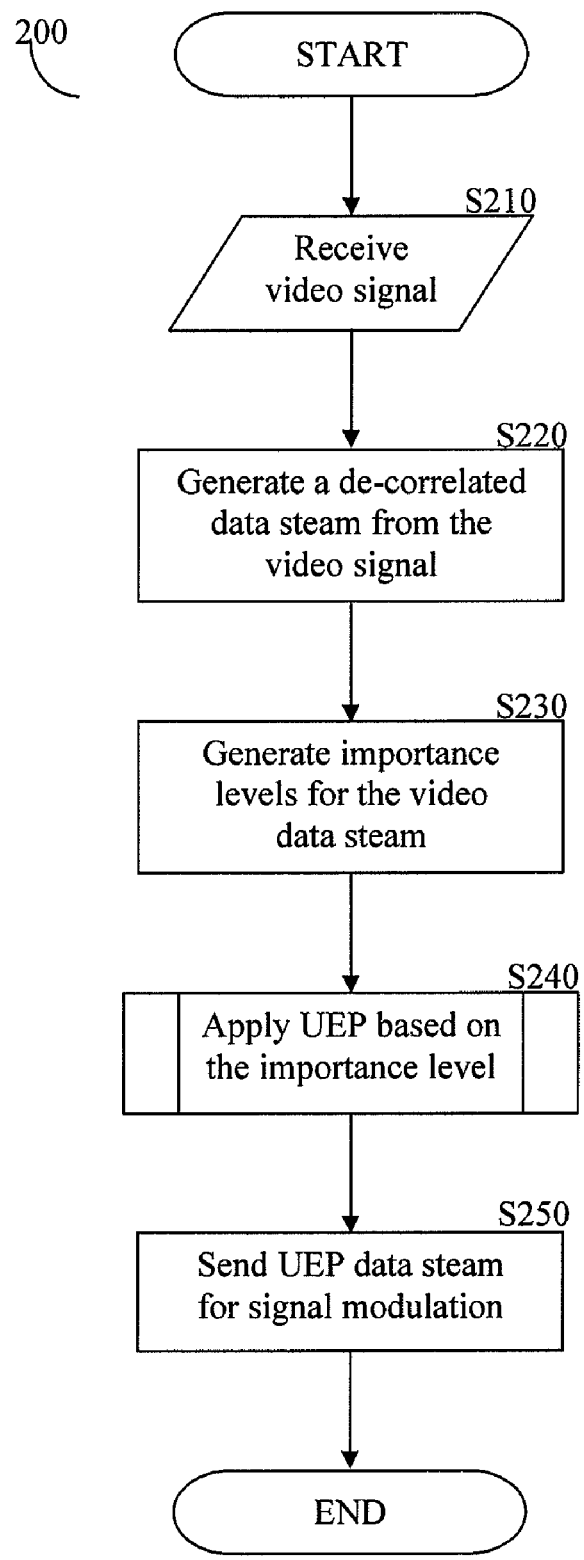
FIG. 2 is a flowchart showing a scheme for unequal error protection during wireless transmission of video according to the invention.

FIG. 2 shows an exemplary flowchart 200 for the transmission of a video signal using UEP in accordance with the invention. In step S210, a video signal is received and in step S220, a de-correlating transform, such as a discrete cosine transform (DCT), is performed, resulting in a data stream. In step S230, the importance level respective of components and bits is generated. In step S240, a UEP coding is performed on the data stream using, for example, the scheme suggested with respect to FIG. 5, discussed in more detail above. However, a person skilled in the art would note that other UEP schemes may be used which are still within the scope of the invention. In step S250, the UEP data stream is sent for signal modulation for the purpose of wireless transmission.

Figure 3:
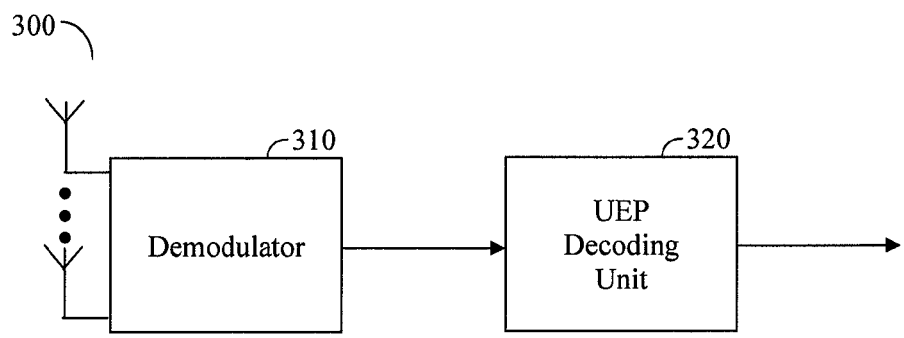
FIG. 3 is a block diagram of a receiver configured to receive transmissions of an unequal error protection scheme according to the invention.

FIG. 3 is an exemplary block diagram of a portion of a receiver 300 that is configured for UEP reception. A demodulator 310 is configured to receive a wireless signal from an antenna 330, which may be a multiple-input multiple-output (MIMO) antenna and generate a UEP data stream. A UEP decoding unit 320 is configured to generate a de-correlated video stream based on the knowledge of the UEP scheme used, for example the UEP scheme discussed with respect of FIG. 5. A person skilled in the art would recognize that a variety of error correction and error detection mechanisms may be used to satisfy the UEP requirements disclosed herein and these are within the scope of the invention. The UEP scheme used must be consistent between the transmitter and the receiver.

Figure 4:
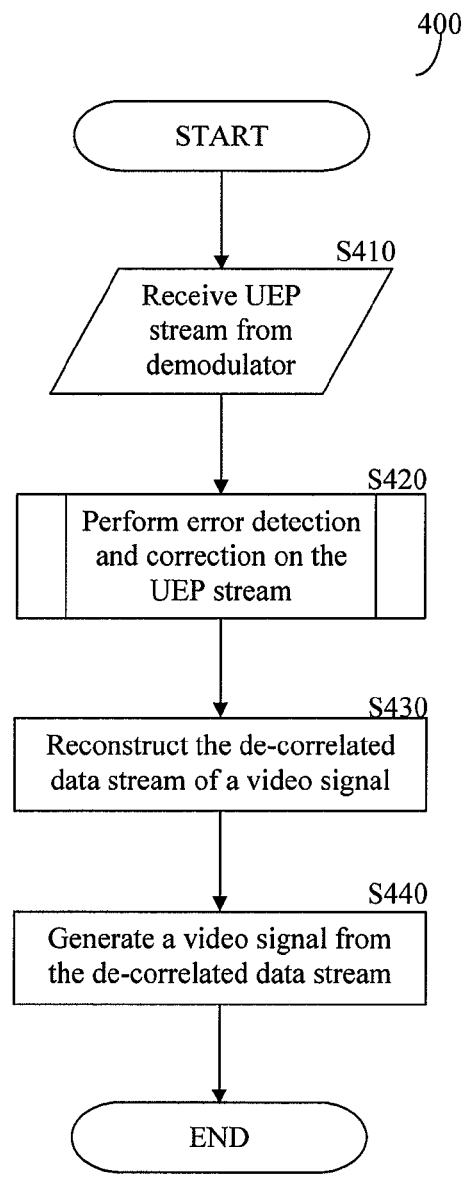
FIG. 4 is a flowchart showing a scheme for unequal error protection during wireless reception of video according to the invention.

FIG. 4 shows an exemplary flowchart 400 for the reception of a video signal using UEP in accordance with the invention. In step S410, a UEP data stream is received from a demodulator. In step S420, error detection and correction is performed for the purpose of handling errors in the received UEP data stream. The error detection and correction is performed in accordance with a predetermined UEP scheme, for example the UEP scheme discussed in more detail with respect to FIG. 5 above. However, a person skilled in the art would note that other UEP schemes may be used within the scope of the invention. In step S430, the de-correlated and error-corrected data stream of the video signal is reconstructed and in step S440, a video signal is generated from the reconstructed de-correlated data stream.

Although the invention is described herein with reference to several embodiments, including the preferred embodiment, one skilled in the art will readily appreciate that other applications may be substituted for those set forth herein without departing from the spirit and scope of the invention. The invention may be further implemented in hardware, software, or any combination thereof. Accordingly, the invention should only be limited by the following Claims.

The invention claimed is:

1. A wireless transmitter for wireless transmission of video including data bytes representing components of a video block, said transmitter comprising: a transmission bit coding unit adapted to apply relatively greater error protection to wireless transmission bits of a wireless transmission frame corresponding to relatively higher order bits of a component byte than to transmission bits of the wireless transmission frame corresponding to relatively lower order bits of the component byte wherein the relatively higher order bits represent more visually significant components of the video block than do the relatively lower order bits.

2. The wireless transmitter of claim 1, further comprising: a color converter for converting an uncompressed video signal to uncompressed video block components; and an antenna for transmitting over a wireless link.

3. The wireless transmitter of claim 2, wherein the components comprise a luminance component and chrominance components.

4. The wireless transmitter of claim 2, wherein the antenna comprises a multiple-input multiple-output (MIMO) antenna.

5. The wireless transmitter of claim 1 further adapted to perform a de-correlating transform, selected from the group consisting of a discrete cosine transform (DCT) and a wavelet transform.

6. The wireless transmitter of claim 1, wherein the relatively greater error protection provides for error correction recovery for a larger number of corrupted bits than does relatively lower error protection provides.

7. The wireless transmitter of claim 1, wherein the error protection of transmission bits corresponding to relatively lower order bits provides error detection when an error is detected in the transmission of the component byte.

8. The wireless transmitter of claim 1, wherein relatively lower error protection is provided to bits associated with a less important components of the video block associated with higher special frequencies of the video block.

9. A method for wireless transmission of video including data bytes representing components of a video block, said method comprising applying transmission bit coding adapted to provide relatively greater error protection to wireless transmission bits of a wireless transmission frame corresponding to relatively higher order bits of a component byte than to those transmission bits of the transmission frame corresponding to relatively lower order bits of the component byte wherein the relatively higher order bits represent more visually significant components of the video block than do the relatively lower order bits.

10. The method of claim 9, further comprising the step of: converting an input uncompressed video signal to uncompressed video components blocks.

11. The method of claim 10, wherein the components block comprise a luminance component and chrominance components.

12. The method of claim 9, further comprising the step of performing a de-correlating transform selected from the group consisting of a discrete cosine transform (DCT) and a wavelet transform.

13. The method of claim 9, wherein the step of applying transmission bit coding adapted to provide relatively greater error protection provides for error correction recovery for a larger number of corrupted bits than does relatively lower error protection provide.

14. A wireless receiver for wireless reception of video including data bytes representing components of a video block, said receiver comprising: a demodulator; and a transmission bit decoding unit adapted to decode bits of a transmission frame where relatively greater error protection was applied to wireless transmission bits corresponding to relatively higher order bits of a component byte than to those transmission bits corresponding to relatively lower order bits of the component byte wherein the relatively higher order bits represent more visually significant components of the video block than do the relatively lower order bits.

15. The wireless receiver of claim 14, further comprising: an antenna for transmitting over a wireless link.

16. The wireless receiver of claim 15, wherein the antenna comprises a multiple-input multiple-output (MIMO) antenna.

17. The wireless receiver of claim 14, wherein the decoding unit comprises a predefined scheme.

18. A method for reception of video including data bytes representing components of a video block, comprising receiving a wireless transmission frame over a wireless link; and decoding bits of a transmission frame where relatively greater error protection was applied to wireless transmission bits corresponding to relatively higher order bits of a component byte than to those transmission bits corresponding to relatively lower order bits of the component byte wherein the relatively higher order bits represent more visually significant components of the video block than do the relatively lower order bits.

* * * * *